US012610799B2

(12) United States Patent  
Li et al.

(10) Patent No.: US 12,610,799 B2  
(45) Date of Patent: Apr. 21, 2026

(54) COATING METHOD FOR MAKING CHIP, CHIP SUBSTRATE, AND CHIP

(71) Applicant: Tencent Technology (Shenzhen) Company Limited, Shenzhen (CN)

(72) Inventors: Dengfeng Li, Shenzhen (CN); Wenlong Zhang, Shenzhen (CN); Kunliang Bu, Shenzhen (CN); Maochun Dai, Shenzhen (CN); Yarui Zheng, Shenzhen (CN)

(73) Assignee: TENCENT TECHNOLOGY (SHENZHEN) COMPANY LIMITED, Shenzhen (CN)

( * ) Notice: Subject to any disclaimer, the term of this patent is extended or adjusted under 35 U.S.C. 154(b) by 650 days.

(21) Appl. No.: 18/070,296

(22) Filed: Nov. 28, 2022

(65) Prior Publication Data

US 2023/0099146 A1    Mar. 30, 2023

Related U.S. Application Data

(63) Continuation of application No. PCT/CN2021/126204, filed on Oct. 25, 2021.

(30) Foreign Application Priority Data

Jun. 17, 2021    (CN) .......................... 202110671013.1

(51) Int. Cl.
| | |
|---|---|
| *H01L 21/768* | (2006.01) |
| *C23C 14/54* | (2006.01) |
| *H10N 60/01* | (2023.01) |

(52) U.S. Cl.
CPC ........ *H01L 21/76898* (2013.01); *C23C 14/54* (2013.01); *H10N 60/01* (2023.02)

(58) Field of Classification Search
CPC ........... H01L 21/2855; H01L 21/76843; C23C 14/505; C23C 14/046; C23C 14/225
See application file for complete search history.

(56) References Cited

U.S. PATENT DOCUMENTS

| | | | |
|---|---|---|---|
| 5,741,404 A | 4/1998 | Cathey | |
| 6,716,322 B1 * | 4/2004 | Hedge ................... | C23C 14/044 |
| | | | 204/192.12 |

(Continued)

FOREIGN PATENT DOCUMENTS

| | | |
|---|---|---|
| CN | 101299410 A | 11/2008 |
| CN | 101752203 A | 6/2010 |

(Continued)

OTHER PUBLICATIONS

Tencent Technology, ISR, PCT/CN2021/126204, Mar. 14, 2022, 3 pgs.

(Continued)

*Primary Examiner* — Jaehwan Oh  
(74) *Attorney, Agent, or Firm* — Morgan, Lewis & Bockius LLP

(57)    ABSTRACT

This application discloses a coating method for making a chip. The method includes: fixing a substrate on a base. The substrate includes a hole. The method includes controlling an included angle between a plane on which the substrate is located and a deposition direction of a coating material to be greater than 0 degrees and less than 90 degrees. The method includes controlling the substrate to rotate with respect to an axis perpendicular to the plane on which the substrate is located. The method includes during the rotation of the substrate, controlling the coating material to enter the hole along the deposition direction such that the coating material is deposited on a sidewall of the hole.

16 Claims, 3 Drawing Sheets

(56) References Cited

U.S. PATENT DOCUMENTS

| | | | | |
|---|---|---|---|---|
| 2007/0045820 A1* | 3/2007 | Rybnicek | .......... | H01L 21/76898 |
| | | | | 257/E21.597 |
| 2013/0105298 A1* | 5/2013 | Tsunekawa | ......... | H01J 37/3429 |
| | | | | 204/298.03 |
| 2014/0014497 A1* | 1/2014 | Druz | ....................... | C23C 14/10 |
| | | | | 204/192.11 |

FOREIGN PATENT DOCUMENTS

| | | | |
|---|---|---|---|
| CN | 103194730 A | 7/2013 | |
| CN | 104124201 A | 10/2014 | |
| CN | 106783620 A | 5/2017 | |
| CN | 108387563 A | 8/2018 | |
| CN | 111153379 A | 5/2020 | |
| CN | 111235539 A | 6/2020 | |
| CN | 111933525 A | 11/2020 | |
| JP | H 06151710 A | 5/1994 | |
| TW | 200308013 A | 12/2003 | |
| TW | 200527506 A | 8/2005 | |

OTHER PUBLICATIONS

Tencent Technology, WO, PCT/CN2021/126204, Mar. 14, 2022, 4 pgs.

Tencent Technology, IPRP, PCT/CN2021/126204, Dec. 14, 2023, 5 pgs.

Ivan Filippov et al., "Superconducting TSV Contact for Cryoelectronic Devices", Superconductor Science and Technology, vol. 37, No. 1, DOI: 10.1088/1361-6668/ad1460, Dec. 2023, 6 pgs.

J.A. Alfaro-Barrantes es al., "Superconducting High-Aspect Ratio Through-Silicon Vias with DC-Sputtered AI for Quantum 3D Integration", IEEE Electron Device Letters, vol. 41, No. 7, DOI: 10.1109/LED.2020.2994862, Jul. 2020, 4 pgs.

Tansel Karabacak et al., "Enhanced Step Coverage by Oblique Angle Physical Vapor Deposition", Journal of Applied Physics, vol. 97, No. 12, DOI: 10.1063/1.1937476, Jun. 2005, 6 pgs.

Tencent Technology, Extended European Search Report and Supplementary Search Report, EP Patent Application No. 21945745.4, Feb. 22, 2024, 15 pgs.

* cited by examiner

Deposition direction

1

COATING METHOD FOR MAKING CHIP, CHIP SUBSTRATE, AND CHIP

CROSS-REFERENCE TO RELATED APPLICATIONS

This application is a continuation application of PCT Patent Application No. PCT/CN2021/126204, entitled "COATING METHOD FOR MAKING A CHIP, CHIP SUBSTRATE, AND CHIP" filed on Oct. 25, 2021, which claims priority to Chinese Patent Application No. 202110671013.1, filed with the State Intellectual Property Office of the People's Republic of China on Jun. 17, 2021, and entitled "COATING METHOD FOR MAKING A CHIP, CHIP SUBSTRATE, AND CHIP", all of which are incorporated herein by reference in their entirety.

FIELD OF THE TECHNOLOGY

Embodiments of this application relate to the field of micro/nano-fabrication technologies, and in particular, to a coating method for making a chip, a chip substrate, and a chip.

BACKGROUND OF THE DISCLOSURE

To enable a quantum chip to accommodate more quantum bits, solutions such as the flip-chip bonding technology and the multilayer stacking technology are proposed, and the through silicon via (TSV) technology is a key technology to realize the chip stacking.

Superconducting materials (such as aluminum, niobium, and titanium nitride) commonly used in a quantum chip are mostly coated in a direction perpendicular to a chip substrate by using a physical vapor deposition (PVD) method. For a through silicon via with a high aspect ratio and high verticality, there are problems that a continuous thin film cannot be deposited on a sidewall of the through hole and a thickness of the thin film on the sidewall is insufficient.

SUMMARY

Embodiments of this application provide a coating method for making a chip, a chip substrate, and a chip, which may improve deposition continuity and a deposition thickness of a coating material on a sidewall of a hole. The technical solutions are as follows:

According to an aspect of the embodiments of this application, a coating method for making a chip is provided, and the method includes:

fixing a to-be-coated substrate on a base, the substrate being provided with a hole;

controlling an included angle between a plane on which the substrate is located and a deposition direction of a coating material to be greater than 0 degrees and less than 90 degrees;

controlling the substrate to rotate around (e.g., with respect to) an axis that is normal (e.g., perpendicular) to the substrate (e.g., perpendicular to a plane of the substrate); and during the rotation of the substrate (e.g., while the substrate is rotating), controlling the coating material to enter the hole along the deposition direction so that the coating material is deposited on a sidewall of the hole.

According to an aspect of the embodiments of this application, a chip substrate is provided, and the chip substrate is coated by adopting the foregoing coating method for making a chip.

According to an aspect of the embodiments of this application, a chip is provided, the chip is preferably configured as a quantum chip, and the chip includes the foregoing chip substrate.

According to an aspect of the embodiments of this application, a coating device is provided. The coating device can include a transmitter configured to generate an electron beam or an ion beam, a target material or a crucible containing the target material, a base for placing a to-be-coated substrate, a first system for controlling the base to incline and rotate, and a second system for applying a bias to the base. The coating device can include one or more processors and memory. The memory stores instructions that, when executed by the one or more processors, cause the one or more processors to perform any of the methods disclosed herein.

According to an aspect of the embodiments of this application, a non-transitory computer-readable storage medium is provided. The computer-readable storage medium stores instructions that, when executed by one or more processors of a coating device, cause the one or more processors to perform any of the methods disclosed herein.

The technical solutions provided in the embodiments of this application may bring the following beneficial effects:

This application uses a coating process based on a variable inclination angle to coat a sidewall of a hole, which, especially for a hole with a high aspect ratio and high verticality, may improve deposition continuity and a deposition thickness of a coating material on the sidewall of the hole, to meet requirements for a thickness and a coverage rate of a thin film on the sidewall. For a superconducting quantum chip, deposition continuity and a deposition thickness of a superconducting material on the sidewall of the hole of the chip substrate may be improved, thereby meeting a requirement of microwave transmission.

BRIEF DESCRIPTION OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other accompanying drawings from the accompanying drawings without creative efforts.

DESCRIPTION OF EMBODIMENTS

To make the objectives, technical solutions, and advantages of this application clearer, the following further describes the implementations of this application in detail with reference to the accompanying drawings.

A quantum computer is a kind of physical device that follows the laws of quantum mechanics to perform high-speed mathematical and logical operations, and store and process quantum information. When an apparatus processes and calculates quantum information, and runs a quantum algorithm, the apparatus is a quantum computer. Characteristics of the quantum computer mainly include high processing speed, strong information processing ability, and wide application range. Compared with a classical computer, the more information is processed, the more favorable it is for the quantum computer to carry out an operation, and therefore accuracy of the operation may further be ensured.

A quantum chip is a core component in the quantum computer. The quantum chip is to integrate quantum circuits on a substrate to further carry a function of quantum information processing. With reference to the development history of conventional computers, to achieve commercialization and industrial upgrading, the quantum computer research needs to take the path of integration after overcoming a bottleneck technology. Superconducting systems, semiconductor quantum dot systems, topological insulator low dimensional electron gas systems, micro-nano photonics systems, and even atomic and ionic systems all intend to move onto chips. In terms of development, superconducting quantum chip systems are technologically ahead of other physical systems. Conventional semiconductor quantum dot systems are also a goal that people put effort into exploring, since the development of the conventional semiconductor industry is already very mature after all. For example, once semiconductor quantum chips break through a threshold of fault-tolerant quantum computing in terms of a decoherence time and manipulation accuracy, it is expected that an existing achievement of the conventional semiconductor industry is integrated to save development costs.

Figure 1:
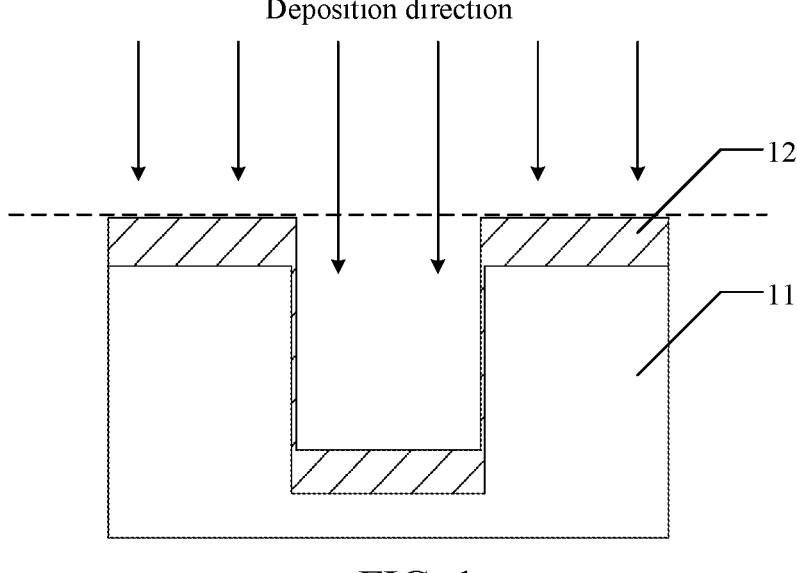
FIG. 1 is a schematic diagram of a coating method for making a chip according to the related art.

At present, in a coating process in which the PVD method is adopted, a coating material is applied on the chip substrate in a direction (that is, along a direction of a normal of the chip substrate) perpendicular to a surface of the chip substrate (or a plane on which the chip substrate is located). As shown in FIG. 1, a deposition direction (a direction indicated by the arrow in FIG. 1) of the coating material is perpendicular to a plane (as shown by the dotted line in FIG. 1) on which a chip substrate 11 is located. For substrates having a step shape, such as substrate 11 with a deep hole structure as shown in FIG. 1, most of coating material 12 is deposited on a surface of the substrate 11 (e.g., top surface) and a bottom part of a hole, and only a very small amount of the coating material 12 is deposited on a sidewall of the hole based on scattering in the hole, as shown in the area filled with oblique lines in FIG. 1. In the semiconductor industry, the PVD method is often used to prepare the plated seed layer, and then a copper plating process is performed to fill a silicon via. For the plated seed layer, a small thickness is required to meet a requirement of the subsequent copper plating process. However, for a superconducting quantum chip, the copper plating process may not be used since a thin film material formed by deposition is required to be in a superconducting state. When a deep silicon via is filled only by a coating material but without the subsequent plating process, the coating material along the sidewall needs to be thick enough to effectively transmit a microwave signal, so a vertical incidence deposition mode cannot meet the requirement.

This application provides a coating method for making a chip, a chip substrate, and a chip, and a basic concept thereof is to use a coating process based on a variable inclination angle to coat a sidewall of a hole, which improves deposition continuity and a deposition thickness of a coating material on the sidewall of the hole, to meet the requirements for a thickness and a coverage rate of a thin film on the sidewall. For a superconducting quantum chip, deposition continuity and a deposition thickness of a superconducting material on the sidewall of the hole of the chip substrate may be improved, thereby meeting a requirement of microwave transmission. Certainly, the coating method for making a chip provided in this application is not limited to coating the substrate of the superconducting quantum chip, but may coat other chips (such as a common integrated circuit chip (IC)), which is not limited in this application.

The technical solution of this application is described below by using several embodiments. It should be noted that each step of the embodiments described below may be performed by a person or by a coating device. That is to say, the "coating method for making a chip" provided in this application may be implemented manually, or may be implemented by a coating device, or may be implemented by interaction between a person and a coating device. Exemplarily, the foregoing coating device is a physical vapor deposition (PVD) device. The coating device includes one or more processors and memory. The memory stores instructions that, when executed by the one or more processors, cause the one or more processors to perform any of the methods disclosed herein.

Figure 2:
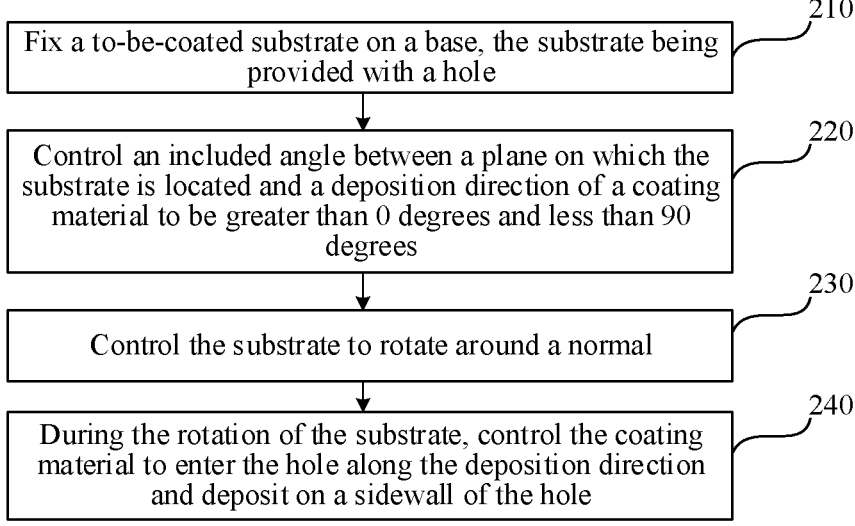
FIG. 2 is a flowchart of a coating method for making a chip according to an embodiment of this application.

Referring to FIG. 2, FIG. 2 is a flowchart of a coating method for making a chip according to an embodiment of this application. The method may include the following several steps (210 to 240):

Step 210. Fix a to-be-coated substrate on a base, the substrate being provided with a hole (e.g., an opening, a groove, a hollow region, etc.).

In the embodiment of this application, a material, a size, and a shape of the substrate are not limited, which may be selected in combination with the purpose of the substrate. Take a substrate of a superconducting quantum chip as an example. The substrate may be made of silicon, so the substrate may further be referred to as a silicon sheet or a silicon substrate.

The substrate is provided with a hole. In some embodiments, a hole structure is processed on the substrate by adopting the Bosch process, for example, a hole with a high aspect ratio and high verticality is obtained by adopting a process of etching-deposition-etching cycle. In some embodiments, the hole on the substrate has characteristics of a high aspect ratio and high verticality. The so-called high aspect ratio means that a ratio of a depth to a width of the hole is large, such as greater than a certain threshold ratio (e.g., 10, 15, 20, etc.). In an example, when the depth of the hole is 200 μm (micron) and the width of the hole is 20 μm, the aspect ratio is 10. The so-called high verticality means that the sidewall of the hole is perpendicular or nearly perpendicular to a plane on which the substrate is located, for example, an included angle between the sidewall of the hole and a surface of the substrate is 90±1 degrees.

In some embodiments, the hole provided on the substrate is a through hole. In some embodiments, the hole provided on the substrate is a blind hole. The through hole is a structure is connected to an upper surface and a lower surface of the substrate by etching through the substrate. The blind hole is a structure that is connected to one surface of the substrate by partially etching the substrate without penetrating the substrate. In this application, either the through hole or the blind hole may be coated by adjusting the included angle between the plane on which the substrate is located and the deposition direction of the coating material to be greater than 0 degrees and less than 90 degrees, and the deposition continuity and thickness of the coating material on the sidewall of the hole may be improved for all types of holes.

In addition, in the embodiment of this application, the shape of the hole is not limited. For example, the hole is a circular hole, or a polygonal hole, or a chamfered polygonal hole, or an irregular pattern hole. The circular hole means that a cross section of the hole is a circle, the polygonal hole means that a cross section of the hole is a polygon (such as a triangle, a rectangle, a pentagon, and a hexagon), the chamfered polygon hole means that a cross section of the hole is a chamfered polygon, that is, an angle of the polygon is an angle of chamfer, for example, a chamfered rectangle may further be called a rounded rectangle, and an irregular pattern hole means that a cross section of the hole is an irregular pattern. In this application, the manner in which the hole is coated hole by adjusting the included angle between the plane on which the substrate is located and the deposition direction of the coating material to be greater than 0 degrees and less than 90 degrees is applicable to holes of various shapes, and the deposition continuity and thickness of the coating material on the sidewall of the hole can be improved for holes of various shapes.

For holes of different shapes, manners for calculating aspect ratios thereof are different. For example, when the hole is a circular hole, an aspect ratio of the hole is a ratio of a depth of the hole to a diameter of the hole. For another example, when the hole is a polygonal hole, or a chamfered polygonal hole, or an irregular pattern hole, an aspect ratio of the hole is a ratio of a depth of the hole to a length of a maximum diagonal of a cross section of the hole. The length of the maximum diagonal refers to a maximum value among lengths of all diagonal line segments passing through the center point of the cross section of the hole. In this way, for holes of different shapes, this application provides corresponding manners for calculating the aspect ratios thereof, improving the accuracy of subsequently determining the included angle between the plane on which the substrate is located and the deposition direction of the coating material based on the aspect ratio.

Step 220. Control an included angle between a plane on which the substrate is located and a deposition direction of a coating material to be greater than 0 degrees and less than 90 degrees.

In some embodiments, the base is adjusted, to make the included angle between the plane on which the substrate is located and the deposition direction of the coating material greater than 0 degrees and less than 90 degrees.

Before coating (that is, before depositing the coating material), an orientation of the substrate is changed through adjusting the base. An objective of the above adjustment is to make the included angle between the plane on which the substrate is located and the deposition direction of the coating material greater than 0 degrees and less than 90 degrees. In an example, the deposition direction of the coating material is a preset direction, and the foregoing included angle is further precalculated and predetermined, so the foregoing objective may be achieved by adjusting the base to change the inclination angle of the substrate, and the included angle between the plane on which the substrate is located and the deposition direction of the coating material is made to be the foregoing degree precalculated and predetermined. In some embodiments, the angle is a value greater than 0 degrees and less than 90 degrees.

In some embodiments, the orientation of the deposition direction of the coating material can be adjusted, to make the included angle between the plane on which the substrate is located and the deposition direction of the coating material greater than 0 degrees and less than 90 degrees. In an example, a direction of the base is preset, and the foregoing included angle is further precalculated and predetermined, so the included angle between the plane on which the substrate is located and the deposition direction of the coating material may be made to be the foregoing angle predetermined and precalculated through adjusting the orientation of the deposition direction of the coating material.

In some embodiments, the orientations of the base and the deposition direction of the coating material can be simultaneously adjusted, to make the included angle between the plane on which the substrate is located and the deposition direction of the coating material greater than 0 degrees and less than 90 degrees. In an example, the foregoing included angle is precalculated and predetermined, and the included angle between the plane on which the substrate is located and the deposition direction of the coating material is the foregoing angle predetermined and precalculated through adjusting the orientations of the base and the deposition direction of the coating material.

After the adjustment of the included angle between the plane of the substrate and the deposition direction of the coating material is completed, the following step 230 may be performed.

Step 230. Control the substrate to rotate with respect to an axis that is normal (i.e., perpendicular) to a base of the substrate or a substrate surface.

Figure 3:
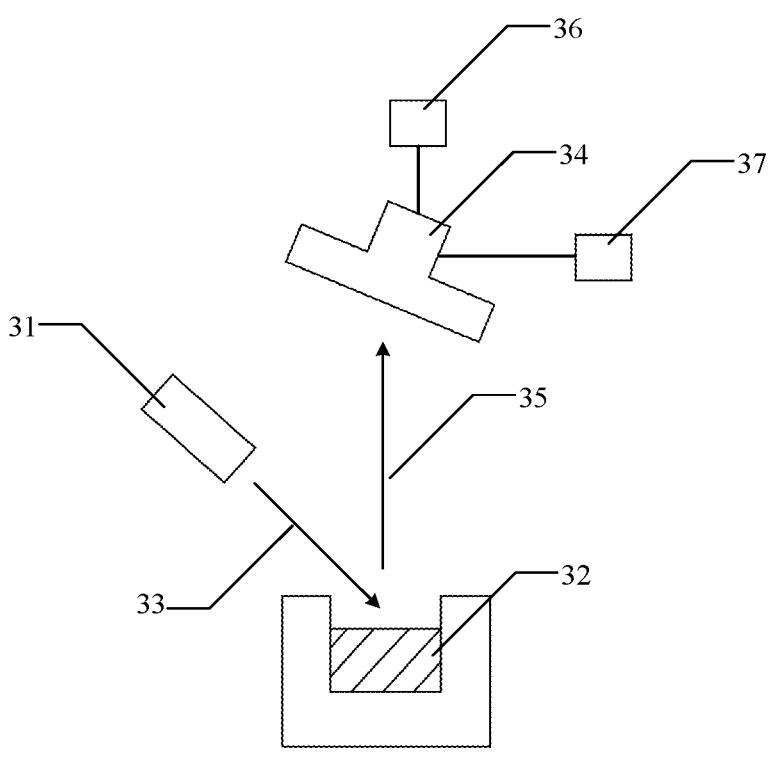
FIG. 3 is a schematic structural diagram of a coating device according to an embodiment of this application.

FIG. 3 exemplarily displays a schematic structural diagram of a coating device configured to implement a coating method for making a chip according to this application. The coating device may include: a transmitter 31 configured to generate an electron beam or an ion beam, a target material or a crucible 32 containing the target material, a base 34 for placing a to-be-coated substrate, a system 36 for controlling the base 34 to incline and rotate, and a system 37 for applying a bias to the base 34. After the to-be-coated substrate is placed on the base 34, the base 34 may be controlled to incline and rotate through the system 36. The electron beam or the ion beam transmitted by the transmitter 31 bombards the target material 32 after acceleration. An arrow 33 represents an incident direction of the electron beam or the ion beam. The coating material sputtered or evaporated from the target material 32 is deposited on the base 34 on which the substrate is placed at a certain rate and in a certain direction. An arrow 35 represents the deposition direction of the coating material. During the deposition of the coating material, the system 36 controls an inclination angle $\theta+\delta\theta$ of the base 34 and controls the base 34 to rotate at an angular velocity $\omega$, thereby driving the substrate to rotate around the normal at an angular velocity $\omega$. In addition, during the deposition of the coating material, the system 37 applies a negative bias to the base 34 to increase a deposition probability of the coating material.

Because in the process of adjusting the base in step 220, the deposition direction of the coating material needs to be known, the deposition direction may be obtained by calculation in advance through experiments. For example, positions of the transmitter 31 and the target material 32 in FIG. 3 are fixed, the electron beam or the ion beam transmitted by the transmitter 31 bombards the target material 32 after acceleration, the coating material sputtered or evaporated from the target material 32 moves at a certain rate and in a certain direction, and the deposition direction is obtained through measuring a movement direction of the coating material.

Certainly, in some other examples, in addition to adjusting the included angle between the plane on which the substrate is located and the deposition direction of the coating material through adjusting the base to change an inclination angle of the substrate, the foregoing included angle may further be adjusted by adjusting the deposition direction of the coating material. For example, at least one of a position of the transmitter 31, a position of the target material 32, an orientation of the electron beam or the ion beam transmitted by the transmitter 31 may be adjusted to realize the adjustment of the deposition direction of the coating material.

Step 240, During the rotation of the substrate, control the coating material to enter the hole along the deposition direction and deposit on a sidewall of the hole.

During the deposition of the coating material, the coating material moves along the deposition direction. Apart of the coating material may deposit on a surface of the substrate, and a part of the coating material may enter the hole of the substrate and deposit on the sidewall of the hole.

In the embodiment of this application, the included angle between the deposition direction and the plane on which the substrate is located is greater than 0 degrees and less than 90 degrees. For example, the base 34 is controlled to incline (e.g., tilt) by a certain angle through the system 36 in FIG. 3, to make the included angle between the deposition direction of the coating material and the plane on which the substrate is located greater than 0 degrees and less than 90 degrees, that is, the coating material enters the hole obliquely rather than vertically, which helps improve the deposition continuity and thickness of the coating material on the sidewall of the hole, to meet requirements for a thickness and a coverage rate of a thin film (e.g., a 1 nm film, or 5 nm film, or 100 nm film, or 1000 nm film) on the sidewall.

In an exemplary embodiment, the foregoing included angle is $\theta+\delta\theta$, where $\theta$ is determined based on the aspect ratio of the hole, and $\delta\theta$ is an adjustable angle. That is, $\theta$ may be calculated through a relevant calculation formula based on the aspect ratio of the hole, and $\delta\theta$ may be adjusted based on an actual deposition effect. In short, the foregoing included angle includes a fixed part determined based on the aspect ratio and an adjustable angle that can be set flexibly. After the included angle is determined based on the aspect ratio, the included angle may be adjusted flexibly based on an actual condition, which is convenient to improve a subsequent coating effect.

In addition, to ensure that appropriate included angles can be determined for various types of holes, this application provides corresponding calculation formulas for the included angles of different types of holes.

In an example, regardless of whether the hole is a through hole or a blind hole, $\theta=\arctan(D/L)$, D is being a depth of the hole, L being a width of the hole, and an aspect ratio of the hole being D/L.

Figure 4:
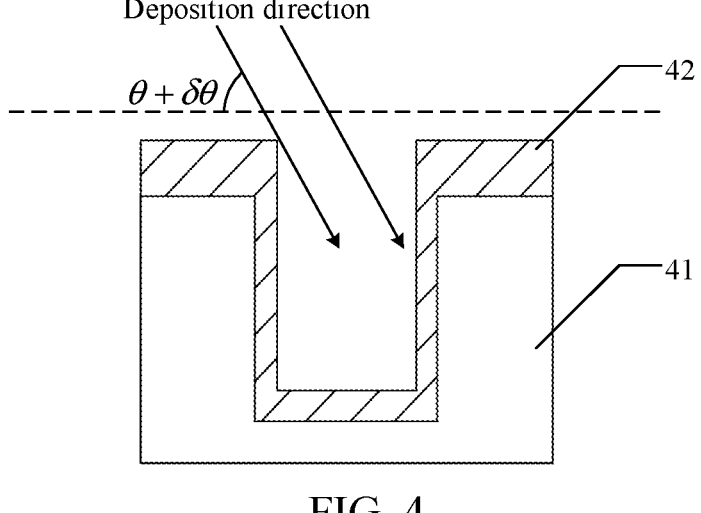
FIG. 4 is a schematic diagram of coating a sidewall of a blind hole with a variable inclination angle according to an embodiment of this application.

In another example, when the hole is a blind hole, $\theta=\arctan(D/L)$, D being a depth of the hole, and L being a width of the hole. FIG. 4 is a schematic diagram of coating a sidewall of a blind hole with a variable inclination angle. 41 is a substrate with a blind hole, 42 is a thin film (as shown in the area filled with oblique lines in FIG. 4) deposited on a surface of the substrate 41 and the sidewall of the hole, and a direction indicated by the arrow is a deposition direction (that is the deposition direction of the coating material) of the thin film. $\theta$ is an included angle between the deposition direction of the thin film and the surface of the substrate determined based on the aspect ratio of the hole, that is, $\arctan \theta=D/L$. D is a depth of the hole, and L is a width of the hole. $\delta\theta$ is an adjustment amount of the included angle between the deposition direction of the thin film and the surface of the substrate according to an actual coating condition. When the coating material enters an inner part of the hole, the bias applied to the base causes the coating material to deviate from the original incident direction. In addition, when the coating material has an electric charge, a mirror force inside the hole may also cause the coating material to deflect to a certain extent. On the other hand, when the coating material comes into contact with the sidewall of the hole, only a part of the material is captured by the sidewall of the hole to form a thin film, and another part of the material is reflected on the sidewall of the hole and finally deposited elsewhere to form a thin film. Because the coating material captured by the sidewall of the hole still has a certain amount of energy, the coating material may slip on the sidewall of the hole and finally stay on the sidewall of the hole to form a thin film after the energy is reduced to a certain extent. Based on the above reasons, during actual operation, the included angle between the deposition direction of the thin film and the surface of the substrate needs to be adjusted to a certain extent. $\delta\theta$ is adjusted through performing splitting and then observing an actual filling condition of the thin film on the sidewall after the filling is completed, to determine an optimal included angle $\theta+\delta\theta$ between the deposition direction of the thin film and the surface of the substrate. For verification, the substrate can be broken along the hole and observed with an electron microscope to determine the thickness of the thin film on the sidewall, to accordingly, determine an appropriate value of $\delta\theta$ (or to determine an appropriate value of $\theta+\delta\theta$). After the value is determined, the included angle between the deposition direction of the thin film and the plane on which the substrate is located may be controlled based on this value, and then, through coating the substrate, a substrate coated with a thin film that meets the requirements can be produced without performing splitting and observation.

Figure 5:
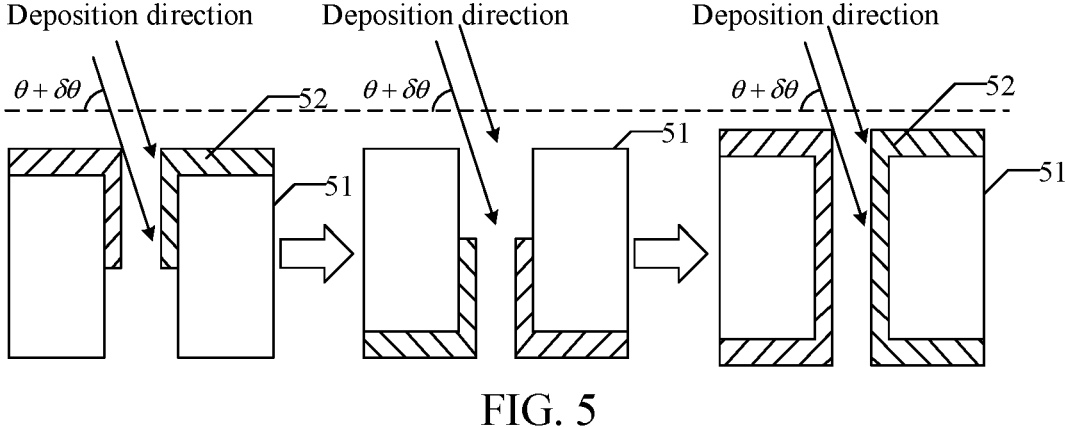
FIG. 5 is a schematic diagram of coating a sidewall of a through hole with a variable inclination angle according to an embodiment of this application.

In another example, when the hole is a through hole, $\theta=\arctan(D/2L)$, D being a depth of the hole, and L being a width of the hole. In this case, after one surface of the substrate is coated, the substrate is turned over, to coat another surface of the substrate, thereby ensuring the deposition continuity and thickness of the coating material on each of the sidewall of the through hole, and improving the coating effect of the through hole. FIG. 5 is a schematic diagram of coating a sidewall of a through hole with a variable inclination angle, where 51 is a substrate with a through hole, 52 is a thin film (as shown in the area filled with oblique lines in FIG. 5) deposited on a surface of the substrate 51 and the sidewall of the hole, and a direction (that is, the deposition direction of the coating material) indicated by the arrow is the deposition direction of the thin film. The through hole may be coated from an upper surface and a lower surface of the substrate 51, so in order to obtain a better filling effect of the thin film, the following steps may be adopted: Firstly, thin film deposition is performed from one surface of the substrate 51, and the included angle $\theta+\delta\theta$ between the deposition direction of the thin film and the surface of the substrate 51 is determined, where $\theta=\arctan(D/2L)$. $\delta\theta$ is adjusted according to the actual coating effect. After that, the substrate 51 is turned over. The substrate 51 may be taken out of a coating device and turned over manually, or a special-purpose base may be designed to turn over the substrate 51 automatically. And then the thin film deposition is performed from another surface of the substrate 51., Similarly, the included angle between the deposition direction of the thin film and the surface of the substrate 51 is set to be $\theta+\delta\theta$, to finally complete thin film filling of the through hole.

In the embodiment of this application, when the hole is a circular hole, the width of the hole mentioned above is a diameter of the hole; and when the hole is a polygonal hole, or a chamfered polygonal hole, or an irregular pattern hole, the width of the hole mentioned above is a ratio of the length of the maximum diagonal of the cross section of the hole.

In addition, the included angle between the plane on which the substrate is located and the deposition direction may be adjusted through adjusting the inclination angle of the substrate; and/or, the included angle between the plane on which the substrate is located and the deposition direction is changed through adjusting the orientation of the deposition direction. For example, when the included angle between the deposition direction of the thin film and the substrate is controlled, the deposition direction of the thin film is kept unchanged, and a placement angle of the base is adjusted to change the inclination angle of the substrate; or, the placement angle of the base is kept unchanged (that is, the inclination angle of the substrate is kept unchanged), the deposition direction of the thin film is adjusted to make the included angle between the deposition direction of the thin film and the substrate be adjusted within a range of 0 degrees to 90 degrees.

In an exemplary embodiment, when the substrate is provided with a plurality of the holes and the plurality of the holes are coated at the same time, $\theta$ is determined based on an aspect ratio of a target hole of the plurality of the holes, and the target hole is a hole with a largest aspect ratio among the foregoing plurality of the holes. That is to say, when the substrate is provided with a plurality of the holes and the plurality of the holes are coated at the same time, the included angle between the plane on which the substrate is located and the deposition direction of the coating material is determined based on the aspect ratio of the target hole of the plurality of the holes. In this way, when the plurality of holes are coated at the same time, it can be ensured that a continuous thin film with an appropriate thickness is deposited on the sidewall of each hole, which takes into account the coating efficiency and coating effect.

In an exemplary embodiment, the deposition method of the coating material is the physical vapor deposition method, such as electron beam evaporation or magnetron sputtering, to ensure that the coating material can be successfully sputtered onto a wall of the hole.

In an exemplary embodiment, during the deposition of the coating material, a negative bias is applied to the base to attract plasma, so that more metal plasma enters the hole, which helps to increase the probability that the coating material is deposited on the substrate (e.g., along the sidewall).

In an exemplary embodiment, the substrate is a substrate of a superconducting quantum chip (such as a silicon sheet), and the coating material is a superconducting material (for example, materials such as aluminum, niobium, and titanium nitride). That is to say, through the coating method in this application, continuous thin films with appropriate thicknesses may be deposited on both the substrate of the superconducting quantum chip and the sidewall of the hole.

In addition, this application provides the following two manners to form component structures such as a capacitor and a resonator on the surface of the substrate. According to the actual condition, an appropriate manner may be selected to form the component structures on the surface of the substrate to improve the flexibility of obtaining component results.

In a possible implementation, coating is performed before a photoresist is coated. For example, a surface of the substrate is coated with a photoresist, to form a first photoresist layer; the first photoresist layer is exposed, to form an exposed first photoresist layer after, where a thin film on the substrate is formed by deposition of the coating material, and an area of the thin film covered by the exposed first photoresist layer is a first component structure area; the first component structure area is etched, and the area on the thin film covered by the exposed first photoresist layer is retained, to form a first component structure; and the exposed first photoresist layer is removed.

In another possible implementation, the photoresist is coated before the coating is performed. Before coating, a surface of the substrate is coated with a photoresist, to form a second photoresist layer; the second photoresist layer is exposed, to form an exposed second photoresist layer, where an area of the surface of the substrate that is not covered by the exposed second photoresist layer is a second component structure area; the substrate with the exposed second photoresist layer is coated, to form a second component structure in the second component structure area; and the exposed second photoresist layer and a coating material attached to the exposed second photoresist layer is removed. The manner of processing and producing the component structure is a lift-off method (that is, a metal-stripping process).

The technical solutions provided in this application use a coating process based on a variable inclination angle to coat a sidewall of a hole, which, especially for a hole with a high aspect ratio and a high verticality, may improve deposition continuity and a deposition thickness of a coating material on the sidewall of the hole, to meet requirements for a thickness and a coverage rate of a thin film on the sidewall. For a superconducting quantum chip, a deposition continuity and a deposition thickness of a superconducting material on the sidewall of the hole of the chip substrate may be improved, thereby meeting a requirement of microwave transmission.

In addition, in the technical solutions provided in the embodiment of this application, through adjusting the base, the included angle between the plane on which the substrate is located and the deposition direction of the coating material is made to be greater than 0 degrees and less than 90 degrees; or, through adjusting the orientation of the deposition direction of the coating material, the included angle between the plane on which the substrate is located and the deposition direction of the coating material is made to be greater than 0 degrees and less than 90 degrees. In this way, the flexibility of the included angle adjustment manner is improved, which is convenient to select an appropriate included angle adjustment manner according to a coating environment during the coating, so that the deposition continuity and thickness of the coating material on the sidewall of the hole in various coating environments can be improved.

In addition, the coating method for making a chip provided in this application may be used for the deposition of a superconducting material in a superconducting quantum chip, and may further be used for the deposition of a seed layer in a deep hole in the semiconductor industry, which has a higher process compatibility.

In addition, this application adopts the physical vapor deposition method, such as electron beam evaporation or magnetron sputtering, to perform thin film filling in the hole, and the types of thin films that can be used are significantly increased. In addition, compared with adopting a chemical vapor deposition (CVD) method (the CVD method needs a high temperature environment and is unable to be combined with the lift-off process), the physical vapor deposition method adopted in this application does not need the high temperature environment and can be combined with the lift-off process, which simplifies the processing flow.

Figure 6:
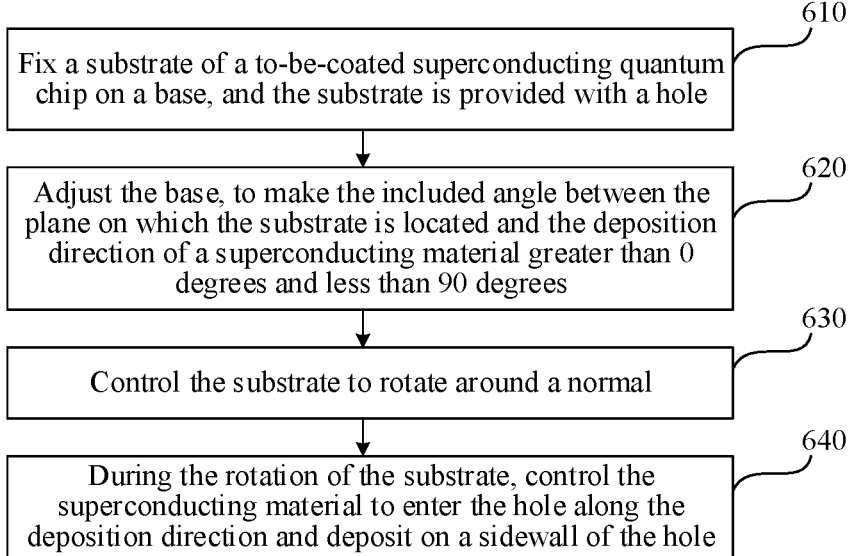
FIG. 6 is a flowchart of a coating method for making a chip according to another embodiment of this application.

Referring to FIG. 6, FIG. 6 is a flowchart of a coating method for making a chip according to another embodiment of this application. In this embodiment, descriptions are made mainly by using an example in which the substrate is a substrate (such as a silicon sheet) of a quantum chip, and the coating material is a superconducting material. The method may include the following steps (610 to 640):

Step 610 Fix a substrate of a to-be-coated superconducting quantum chip on a base, the substrate being provided with a hole.

Step 620. Adjust the base, to make the included angle between the plane on which the substrate is located and the deposition direction of a superconducting material greater than 0 degrees and less than 90 degrees.

Step 630 Control the substrate to rotate around a normal (e.g., an axis that is perpendicular to a base of the substrate or a substrate surface).

Step 640. During the rotation of the substrate, control the superconducting material to enter the hole along the deposition direction and deposit on a sidewall of the hole.

In some embodiments, the substrate of the superconducting quantum chip is a silicon sheet, and the silicon sheet is provided with one or more holes. In some embodiments, a hole structure is processed on the silicon sheet by adopting the Bosch process, for example, a hole with a high aspect ratio and high verticality is obtained by adopting a process of etching-deposition-etching cycle. In some embodiments, the hole provided on the silicon sheet may be a through hole, or may be a blind hole. In addition, in the embodiment of this application, the shape of the hole is not limited. For example, the hole is a circular hole, or a polygonal hole, or a chamfered polygonal hole, or an irregular pattern hole.

In some embodiments, the deep silicon etching technology (such as the Bosch process) is used to process a silicon sheet with a deep silicon via. After being cleaned and blown dry, the silicon sheet is placed in a coating device, and a vacuuming operation is performed on the coating device. After that, when the silicon sheet is waited to be transferred by the device to a coating position, an angle $\theta+\delta\theta$ between the deposition direction of the thin film and a surface of the silicon sheet is set. 9 may be determined based on an aspect ratio of the silicon via, and 60 may be adjusted according to the actual observed coating effect. Next, a rotational angular velocity $\omega$ of the base is set, for example, $\omega$ is 1-50 rpm (rotation per minute). In some embodiments, $\omega=20$ rpm. Then a deposition rate of the thin film is set. Generally, the deposition rate of the thin film is adjusted through changing the power of electron beam or ion beam bombarding the target material. In an example, the deposition rate of the thin film is 0.1 Å/s-100 Å/s. After the deposition rate of the thin film is determined, a deposition time of the thin film may be set according to a required thickness of the thin film. For a structure of a bind silicon via, after the thin film deposition step is completed, the silicon sheet is split, and the deposition condition of the thin film on the sidewall of the blind silicon via is observed with an electron microscope. For a structure of a through silicon via, a part of the structure of the through silicon via may be filled first, then the silicon sheet is turned over, to continuously perform the thin film deposition from the other side of the silicon sheet by adopting the same coating parameters (including an included angle, a deposition rate of the thin film, and a deposition time of the thin film). After that, the silicon sheet is split, and the deposition condition of the thin film on the sidewall of the through silicon via is observed with an electron microscope. During the test stage of the process, the silicon sheet is split to observe the actual filling condition of the thin film on the sidewall, to determine an appropriate degree of the included angle. After the value is determined, the included angle between the deposition direction and a surface of the silicon sheet is controlled based on this value, and then, through coating the substrate, a substrate coated with a thin film that meets the requirements can be produced without performing splitting and observation. In some embodiments, a thickness of the thin film on the sidewall of the hole is about 100 nm. When the thin film deposition is performed on the through hole, an upper surface and a lower surface of the silicon sheet are further be deposited with thin films, and the obtained thin films on the upper surface and the lower surface of the silicon sheet are directly connected to the thin film in the through silicon via. After that, by spin-coating the photoresist and using a photoetching method, the to-be-processed component structure such as a resonant cavity and a capacitor in the superconducting quantum chip is defined on the surface of the silicon sheet. After the pattern structure is defined, the wet etching method or the dry etching method is adopted to etch the component structure on the surface of the silicon sheet. In addition, because the physical vapor deposition method is adopted in this application, such as electron beam evaporation or magnetron sputtering, which does not require a high temperature coating condition, the component structure on the surface of the silicon sheet may be processed by adopting the lift-off process. Specifically, the photoresist is spin-coated on the surface of the silicon sheet before coating, and then the component structure is defined by photoetching. After the coating is performed, the photoresist is removed with acetone or a special degumming liquid to obtain the component structure, and then the surface structure of the silicon sheet is directly connected to the thin film in the through hole.

An exemplary embodiment of this application further provides a chip substrate, and the chip substrate is coated by adopting the coating method for making a chip described above.

An exemplary embodiment of this application further provides a chip, and the chip is preferably configured as a quantum chip. The chip includes the foregoing chip substrate, and the chip substrate is coated by adopting the coating method for making a chip described above. In some embodiments, the chip is a quantum chip. The quantum chip is a chip integrated with quantum circuits. Certainly, in some other embodiments, the chip may further be a common IC chip, which is not limited in the embodiments of this application.

It is to be understood that "plurality of" mentioned in the specification means two or more. In addition, the step numbers described in this specification merely schematically show a possible execution sequence of the steps. In some other embodiments, the steps may not be performed according to the number sequence. For example, two steps with different numbers may be performed simultaneously, or two steps with different numbers may be performed according to a sequence contrary to the sequence shown in the figure. This is not limited in the embodiments of this application.

The foregoing descriptions are merely examples of the embodiments of this application, but are not intended to limit this application. Any modification, equivalent replacement, or improvement made without departing from the spirit and principle of this application should fall within the protection scope of this application.

Note that the various embodiments described above can be combined with any other embodiments described herein. The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

What is claimed is:

1. A coating method for making a superconducting quantum chip, the method comprising:
  fixing a substrate on a base, wherein the substrate is provided with a hole;
  controlling an included angle between a plane on which the substrate is located and a deposition direction of a coating material to be greater than 0 degrees and less than 90 degrees;
  controlling the substrate to rotate at an angular velocity ranging from 1 to 50 rpm about an axis that is perpendicular to the plane on which the substrate is located; and
  while the substrate is rotating, controlling the coating material to enter the hole along the deposition direction such that the coating material is deposited on a sidewall of the hole, wherein the coating material is a superconducting material.

2. The method according to claim 1, wherein controlling the included angle between the plane on which the substrate is located and the deposition direction of the coating material to be greater than 0 degrees and less than 90 degrees includes:
  adjusting the base such that the included angle between the plane on which the substrate is located and the deposition direction of the coating material greater than 0 degrees and less than 90 degrees.

3. The method according to claim 1, wherein controlling the included angle between the plane on which the substrate is located and the deposition direction of the coating material to be greater than 0 degrees and less than 90 degrees includes:
  adjusting the deposition direction of the coating material to make the included angle between the plane on which the substrate is located and the deposition direction of the coating material greater than 0 degrees and less than 90 degrees.

4. The method according to claim 1, wherein the hole is one of: a circular hole, a polygonal hole, a chamfered polygonal hole, or a hole having an irregular pattern.

5. The method according to claim 4, wherein
  the polygonal hole, the chamfered polygonal hole, or the hole having an irregular pattern has an aspect ratio determined by a depth of the hole to a length of a maximum diagonal of a cross section of the hole.

6. The method according to claim 1, wherein the included angle is $\theta+\delta\theta$, wherein $\theta$ is determined based on an aspect ratio of the hole, and $\delta\theta$ is an adjustable angle.

7. The method according to claim 6, wherein $\theta=\arctan(D/L)$, D is a depth of the hole, and L is a width of the hole.

8. The method according to claim 6, wherein the hole is a through hole, $\theta=\arctan(D/2L)$, D is a depth of the hole, and L is a width of the hole.

9. The method according to claim 8, further comprising:
  after one surface of the substrate is coated, the substrate is turned over, to coat another surface of the substrate.

10. The method according to claim 1, wherein the substrate includes a plurality of holes, the included angle is determined based on an aspect ratio of a target hole of the plurality of holes, wherein the target hole is a hole with the largest aspect ratio among a plurality of aspect ratios corresponding to the plurality of holes.

11. The method according to claim 1, wherein the coating material is deposited using physical vapor deposition.

12. The method according to claim 1, further comprising:
  after controlling the coating material to enter the hole along the deposition direction and deposit on a sidewall of the hole:
    coating a photoresist on a surface of the substrate, to form a first photoresist layer;
    exposing the first photoresist layer, to form an exposed first photoresist layer, wherein a thin film on the substrate is formed by deposition of the coating material, and an area of the thin film covered by the exposed first photoresist layer is a first component structure area;
    etching an area on the thin film that is not covered by the exposed first photoresist layer, and retaining the first component structure area, to form a first component structure; and
    removing the exposed first photoresist layer.

13. The method according to claim 1, further comprising:
  before fixing the substrate on the base, coating a photoresist on a surface of the substrate to form a second photoresist layer;
  exposing the second photoresist layer, to form an exposed second photoresist layer, wherein an area of the surface of the substrate that is not covered by the exposed second photoresist layer is a second component structure area;
  coating the substrate with the exposed second photoresist layer, to form a second component structure in the second component structure area; and
  removing the exposed second photoresist layer and a portion of the coating material attached to the exposed second photoresist layer.

14. A coating device, comprising:
  a base configured to fix a substrate, wherein the substrate is a superconducting quantum chip provided with a hole; and
  a system configured to:
    control an included angle between a plane on which the substrate is located and a deposition direction of a coating material to be greater than 0 degrees and less than 90 degrees;
    control the substrate to rotate at an angular velocity ranging from 1 to 50 rpm about an axis that is perpendicular to the plane on which the substrate is located; and
    while the substrate is rotating, control the coating material to enter the hole along the deposition direction such that the coating material is deposited on a sidewall of the hole, wherein the coating material is a superconducting material.

15. The coating device according to claim 14, wherein:
  the system is configured to control the included angle between the plane on which the substrate is located and the deposition direction of the coating material to be greater than 0 degrees and less than 90 degrees by:

adjusting the base such that the included angle between the plane on which the substrate is located and the deposition direction of the coating material greater than 0 degrees and less than 90 degrees.

16. The coating device according to claim 14, wherein:

the system is configured to control the included angle between the plane on which the substrate is located and the deposition direction of the coating material to be greater than 0 degrees and less than 90 degrees by:

adjusting the deposition direction of the coating material to make the included angle between the plane on which the substrate is located and the deposition direction of the coating material greater than 0 degrees and less than 90 degrees.

* * * * *